(12) United States Patent
Wu

(10) Patent No.: US 11,258,194 B2
(45) Date of Patent: Feb. 22, 2022

(54) METHOD FOR DESIGNING LAYOUT OF CARD EDGE CONNECTOR AND SERVER CARD

(71) Applicant: ZHENGZHOU YUNHAI INFORMATION TECHNOLOGY CO., LTD., Henan (CN)

(72) Inventor: Ning Wu, Henan (CN)

(73) Assignee: ZHENGZHOU YUNHAI INFORMATION TECHNOLOGY CO., LTD., Henan (CN)

( * ) Notice: Subject to any disclaimer, the term of this patent is extended or adjusted under 35 U.S.C. 154(b) by 387 days.

(21) Appl. No.: 16/493,294

(22) PCT Filed: Mar. 8, 2019

(86) PCT No.: PCT/CN2019/077402
§ 371 (c)(1),
(2) Date: Sep. 11, 2019

(87) PCT Pub. No.: WO2020/010863
PCT Pub. Date: Jan. 16, 2020

(65) Prior Publication Data
US 2021/0367363 A1 Nov. 25, 2021

(30) Foreign Application Priority Data
Jul. 9, 2018 (CN) .......................... 201810746120.4

(51) Int. Cl.
*H01R 12/72* (2011.01)
*G06F 30/392* (2020.01)

(52) U.S. Cl.
CPC ......... *H01R 12/721* (2013.01); *G06F 30/392* (2020.01)

(58) Field of Classification Search
CPC .......................... H01R 12/721; G06F 30/392
(Continued)

(56) References Cited

U.S. PATENT DOCUMENTS 4,836,791 A * 6/1989 Grabbe .................. H01R 12/00
439/79
5,079,671 A * 1/1992 Garrett ................. H01R 12/716
361/600
(Continued)

FOREIGN PATENT DOCUMENTS

| CN | 204859740 U | 12/2015 |
| CN | 105578741 A | 5/2016 |
| CN | 108966497 A | 12/2018 |

OTHER PUBLICATIONS

International Search Report for PCT/CN2019/077402 dated May 28, 2019, ISA/CN.

*Primary Examiner* — Peter G Leigh
(74) *Attorney, Agent, or Firm* — Yue (Robert) Xu; Apex Attorneys at Law, LLP

(57) ABSTRACT

A method for designing a layout of a card edge connector and a server a card are provided. The method includes: determining, based on a type of a GND pin of a card edge connector and space between the card edge connector and GND vias, the number of GND vias connected to the GND pin to maximize the number of the GND vias connected to the GND pin; connecting each GND pin to all the GND vias that match with said GND pin to form one signal return path; and minimizing a length of the signal return path by setting all the GND vias that match with said GND pin in close proximity to said GND pin in the signal return path.

10 Claims, 6 Drawing Sheets

(58) Field of Classification Search
USPC .......................................................... 439/79
See application file for complete search history.

(56) References Cited

U.S. PATENT DOCUMENTS

| | | | | |
|---|---|---|---|---|
| 6,215,671 B1* | 4/2001 | Kalis | ................... | H05K 9/0039 |
| | | | | 361/784 |
| 6,296,496 B1* | 10/2001 | Trammel | ............. | H01R 12/725 |
| | | | | 439/79 |
| 6,473,301 B1* | 10/2002 | Levy | .................... | G11B 25/043 |
| | | | | 324/73.1 |
| 6,558,191 B2* | 5/2003 | Bright | .................. | G02B 6/4246 |
| | | | | 439/541.5 |
| 6,625,881 B2* | 9/2003 | Ammar | ................ | H01R 12/714 |
| | | | | 29/830 |
| 6,704,919 B2* | 3/2004 | Araki | ..................... | G06F 30/367 |
| | | | | 716/112 |
| 6,866,544 B1* | 3/2005 | Casey | .................. | H05K 9/0058 |
| | | | | 439/607.2 |
| 7,168,058 B2* | 1/2007 | Harada | .................. | G06F 30/39 |
| | | | | 716/112 |
| 2002/0017907 A1 | 2/2002 | Araki et al. | | |

* cited by examiner

METHOD FOR DESIGNING LAYOUT OF CARD EDGE CONNECTOR AND SERVER CARD

CROSS REFERENCE OF RELATED APPLICATION

The present application is the national phase of International application No. PCT/CN2019/077402, which claims priority to Chinese Patent Application No. 201810746120.4, titled "METHOD FOR DESIGNING LAYOUT OF CARD EDGE CONNECTOR AND SERVER CARD", filed on Jul. 9, 2018 with the China National Intellectual Property Administration, both of which are incorporated herein by reference in their entirety.

FIELD

The present disclosure relates to the technical field of server card design, and in particular, to a method for designing a layout of a card edge connector and a server card.

BACKGROUND

In the field of server card design, transmission quality of a high-speed signal in channel links is getting more and more attention with an increase of a transmission speed of high-speed interfaces, and a layout design of a server card edge connector closely affects the transmission quality of the high-speed signal. Therefore, it is important to study the layout design of the sever card edge connector.

The current method for designing the layout of the server card edge connector is shown in FIG. 1. As can be seen in FIG. 1, in the method for designing the layout of the server card edge connector, each GND pin of the edge connector (the edge connector is also referred to as gold finger in the art) corresponds to a GND pin, and a distance of 2 mm is set between said GND pin of the edge connector and a GND via connected to said GND pin of the edge connector. Thus, processing of the GND via during a production process will not have an impact on manufacture of said GND pin of the edge connector.

In conventional method for designing the layout of the server card edge connector, when the transmission speed of the high-speed signal is increased, for example, the transmission speed of a PCIE signal is increased from 8 Gbps to 16 Gbps, and the transmission speed of a SAS signal is increased from 12 Gbps to 22.5 Gbps, there is a large return propagation distance between the GND via and said GND pin of the edge connector due to presence of the distance of 2 mm between said GND pin of the edge connector and the GND via connected to said GND pin of the edge connector, and the return propagation distance generates a frequency resonance point in a high-frequency interval for a signal insertion loss waveform, a near-end crosstalk frequency domain waveform, and a far-end crosstalk frequency domain waveform. Specifically, in the conventional method for designing the layout of the server card edge connector, a simulation diagram of the signal insertion loss waveform, a simulation diagram of the near-end crosstalk frequency domain waveform and a simulation diagram of the far-end crosstalk frequency domain waveform are shown in FIG. 2 to FIG. 4, respectively. It can be seen in FIG. 2 to FIG. 4 that obvious resonance points are generated in all three waveforms in a range of 7 GHz 8 GHz in the conventional layout design of the server card edge connector. For a PCIE 3.0 signal with a transmission speed of 8 Gbps, since a fundamental frequency thereof is 4 GHz, which is away from the above-mentioned resonance frequency range of 7 GHz 8 GHz, the transmission quality of said high-speed signal is scarcely affected. However, for a PCIE 4.0 signal with a transmission speed of 16 Gbps, since a fundamental frequency thereof is 8 GHz, which is within the above-mentioned resonance frequency range, the transmission quality of said high-speed signal is heavily affected in case of the conventional layout design of the server card edge connector.

Therefore, for some of the higher frequency signals, the frequency resonance point is generated in the conventional layout design of the server card edge connector, lowering signal transmission quality. In particular, when the frequency resonance point is within the range of the fundamental frequency of the signal of which the transmission speed is increased, the transmission quality of the signal is seriously affected by the frequency resonance point, resulting in an increase in the signal transmission error rate, a decrease in operational stability of the whole system, and even system shutdown.

SUMMARY

A method for designing a layout of a card edge connector and a server card are provided in the present disclosure to solve the problem that transmission quality of some high-speed signals is low and a signal transmission error rate is high.

In order to solve the above technical problem, the following technical solutions are provided in embodiments of the present disclosure.

A method for designing a layout (electronics design) of a card edge connector, which includes:

determining, based on a type of a GND pin of a card edge connector and space between the card edge connector and GND vias, the number of GND vias connected to the GND pin to maximize the number of the GND vias connected to the GND pin;

connecting each GND pin to all the GND vias that match with said GND pin to form one signal return path; and minimizing a length of the signal return path by setting all the GND vias that match with said GND pin in close proximity to said GND pin in the signal return path.

A server card, where the server card includes an edge connector, multiple GND pins are provided in the edge connector, and each of the GND pins is connected to two or more GND vias to form one signal return path.

BRIEF DESCRIPTION OF THE DRAWINGS

For clear illustration of the technical solutions according to embodiments of the present disclosure or conventional techniques, hereinafter are briefly described the drawings to be applied in embodiments of the present disclosure or conventional techniques. Apparently, other drawings may be obtained by those skilled in the art based on the provided drawings without creative efforts.

DETAILED DESCRIPTION

In order for those skilled in the art to better understand the technical solutions of the present disclosure, the present disclosure will be further described in detail with reference to the accompanying drawings and specific embodiments hereinafter. Apparently, the described embodiments are only some rather than all of the embodiments of the present disclosure. Any other embodiments obtained based on the embodiments of the present disclosure by those skilled in the art without any creative effort fall within the scope of protection of the present disclosure.

In the transmission technology of high-speed server signals, there are usually three major factors that affect signal quality: signal transmission attenuation amplitude, impedance continuity and signal-to-signal coupling crosstalk. In order to improve the transmission quality of the high-speed signals transmitted by the entire link system interconnection, two aspects of the signal transmission attenuation and signal-to-signal coupling crosstalk are mainly optimized and improved to ensure the transmission quality of the high-speed signals in the present disclosure.

For a better understanding of the present disclosure, embodiments of the present disclosure are explained in detail below with reference to the accompanying drawings.

First Embodiment

Figure 1:
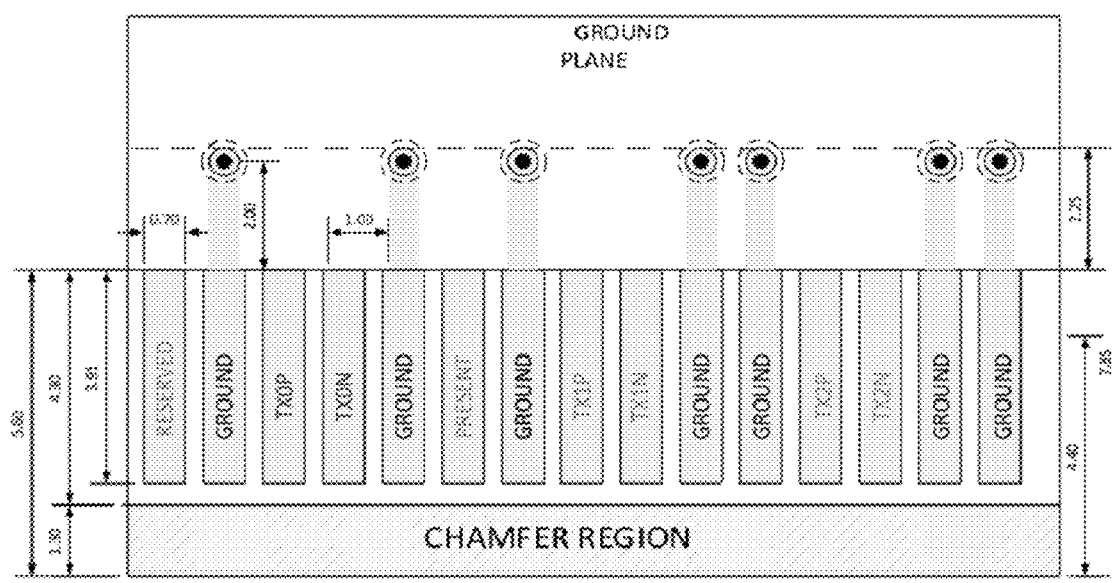
FIG. 1 is a schematic diagram of a layout of an edge connector according to the prior art.
Figure 2:
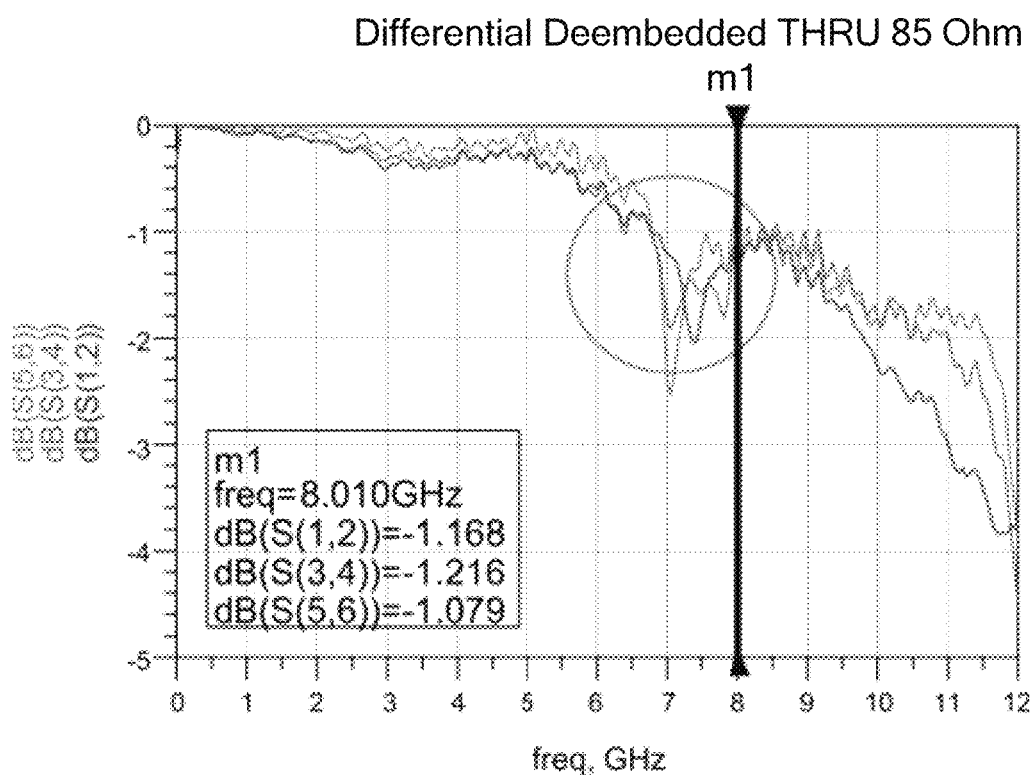
FIG. 2 is a simulation diagram of a signal insertion loss waveform according to the prior art.
Figure 3:
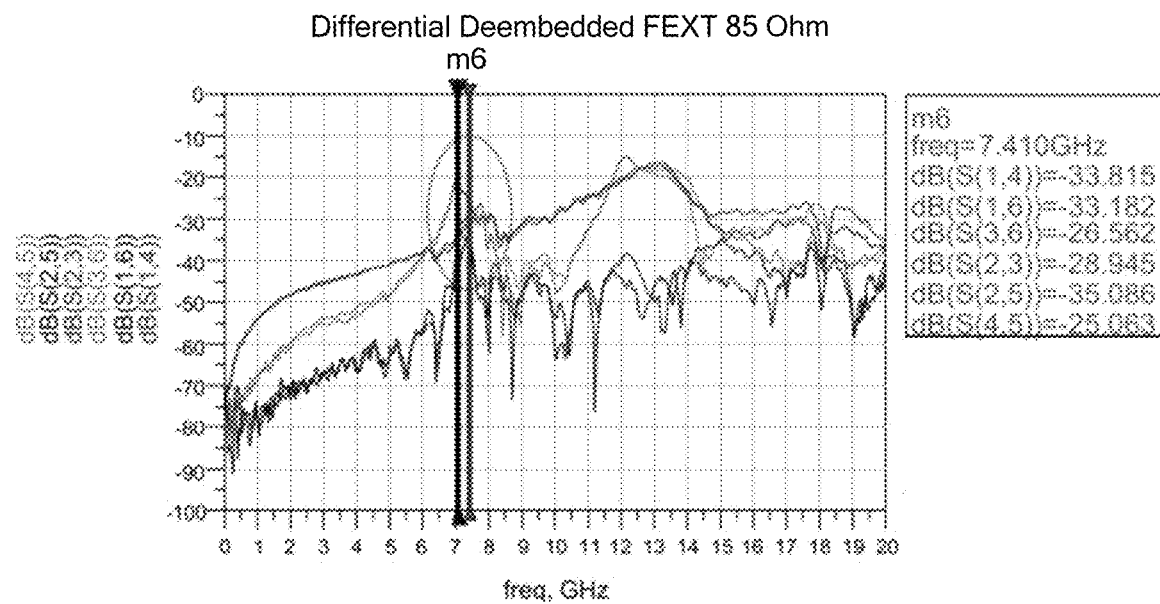
FIG. 3 is a simulation diagram of a near-end crosstalk frequency domain waveform according to the prior art.
Figure 4:
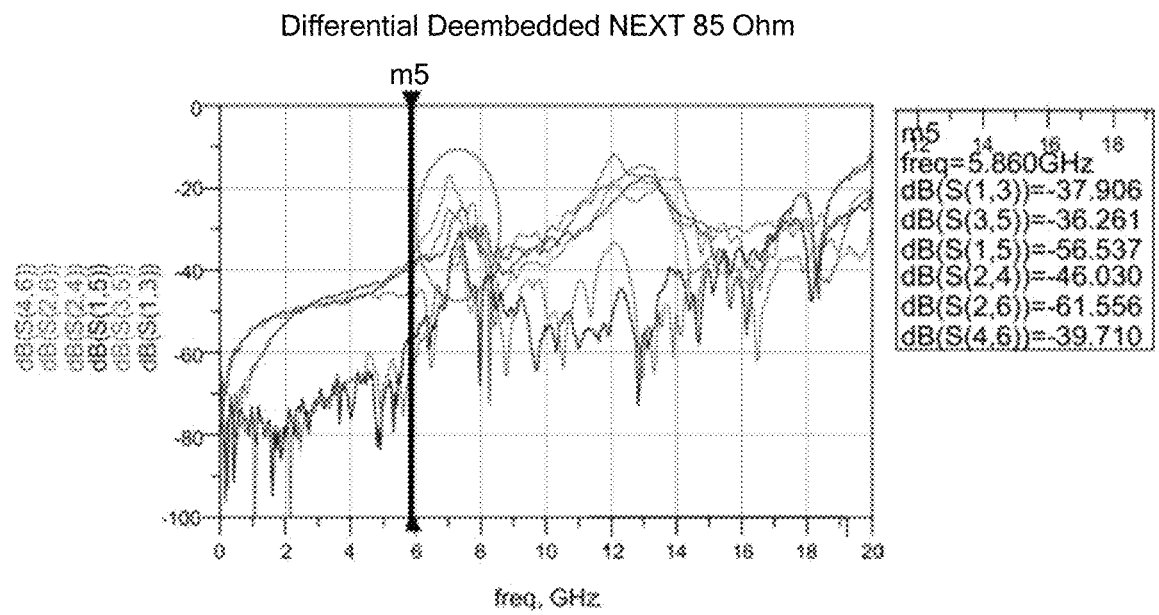
FIG. 4 is a simulation diagram of a far-end crosstalk frequency domain waveform according to the prior art.
Figure 5:
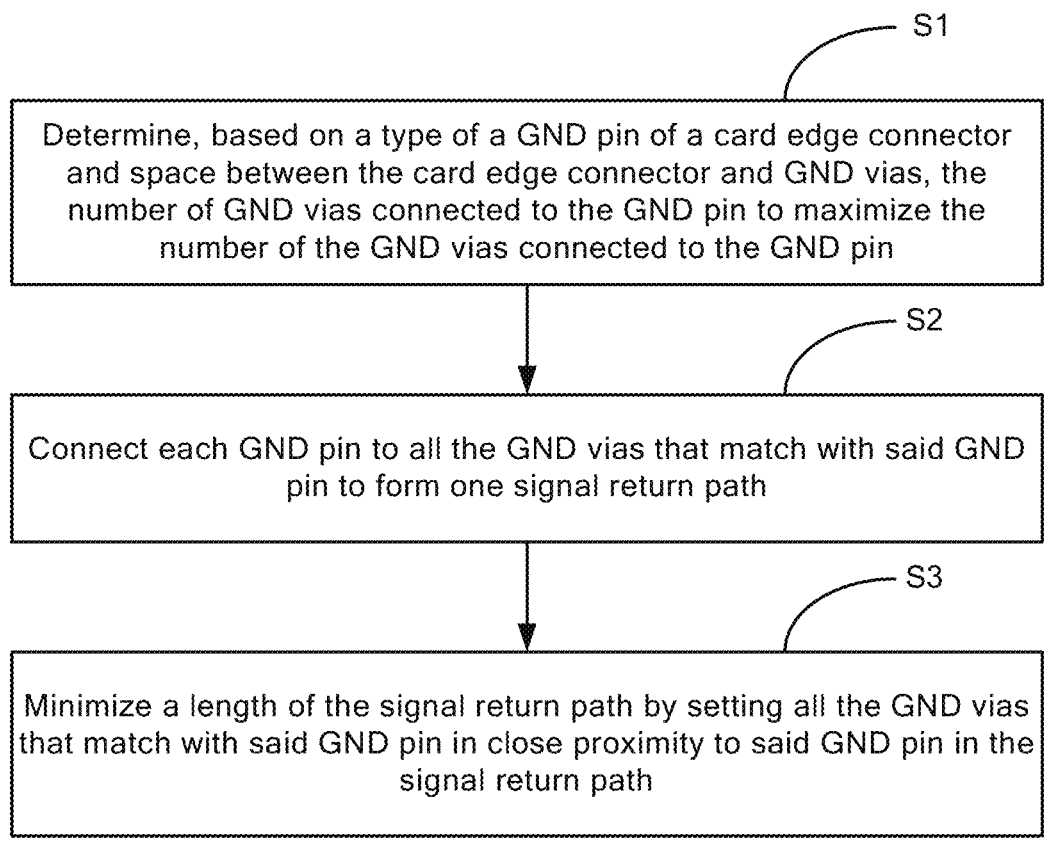
FIG. 5 is a schematic flowchart of a method for designing a layout of a card edge connector according to an embodiment of the present disclosure.

Referring to FIG. 5, FIG. 5 is a schematic flowchart of a method for designing a layout of a card edge connector according to an embodiment of the present disclosure. As shown in FIG. 5, the method for designing a layout of a card edge connector includes the following steps S1 to S3.

Step S1 includes determining, based on a type of a GND pin of a card edge connector and space between the card edge connector and GND vias, the number of GND vias connected to the GND pin to maximize the number of the GND vias connected to the GND pin.

Figure 6:
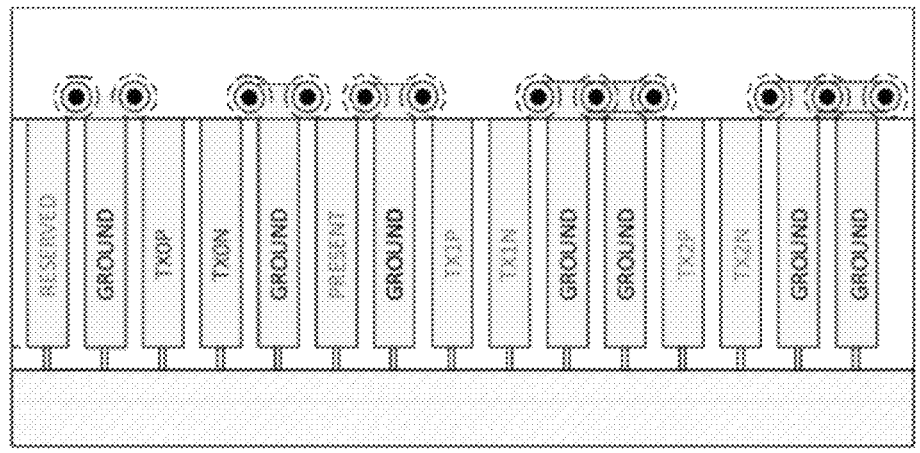
FIG. 6 is a schematic structural diagram of a layout of a card edge connector according to an embodiment of the present disclosure.

Referring to FIG. 6, FIG. 6 is a schematic structural diagram of a layout of a card edge connector according to an embodiment of the present disclosure. Generally, GND pins on a server card edge connector mainly includes two types: single GND pin and dual GND pin. As shown in FIG. 6, the number of GND vias connected to a single GND pin is set to two, and the number of GND vias connected to a dual GND pin is set to three. Compared with the prior art, the number of GND vias interconnected with the GND pin is increased in the embodiment of the present disclosure, which makes full use of the space between the card edge connector and the GND vias, and the degree of attenuation during high-speed signal transmission can be greatly reduced, thereby improving the transmission quality of the high-speed signal.

Step S2 includes connecting each GND pin to all the GND vias that match with said GND pin to form one signal return path.

Since the number of matching GND vias is increased for both types of GND pins, each GND pin and all the GND vias that match with said GND pin are connected to form one signal return path, which can ensure the smooth transmission of signals of the card. In an embodiment, Step S2 includes the following steps S21 and S22.

Step S21 includes connecting each single GND pin of the card edge connector to two GND vias that match with said single GND pin so that said single GND pin and the two GND vias are connected in the same plane.

Step S22 includes connecting each dual GND pin of the card edge connector to three GND vias that match with said dual GND pin so that said dual GND pin and the three GND vias are connected in the same plane.

Step S3 includes minimizing a length of the signal return path by setting all the GND vias that match with said GND pin in close proximity to said GND pin in the signal return path.

In can be seen from Step S2 that each signal return path in this embodiment of the present disclosure includes: a single GND pin and two GND vias in the same plane, or a dual GND pin and three GND vias in the same plane. In each signal return path, all GND vias are arranged in close proximity to the GND pin in the signal return path to minimize the length of the signal return path. In the embodiment of the present disclosure, by reducing the distance between the GND pin and each matching GND via in the signal return path, the signal return path can be effectively optimized and the signal transmission quality can be improved.

Further, a distance between the GND pin of the card edge connector and each GND via that matches with said GND pin in the signal return path is 10-20 μm. By reducing the distance between the GND pin and each GND via matching with the GND pin to 10 microns to 20 microns, the signal return path can be greatly shortened. That is, the return propagation distance between the GND vias and the GND pin of the edge connector is greatly reduced, thereby avoiding the resonance point in the signal insertion loss waveform, the near-end crosstalk frequency domain waveform and the far-end crosstalk frequency domain waveform in the high frequency section, which improves the transmission quality of the high-speed signal and improves the operation stability of the entire system.

Figure 7:
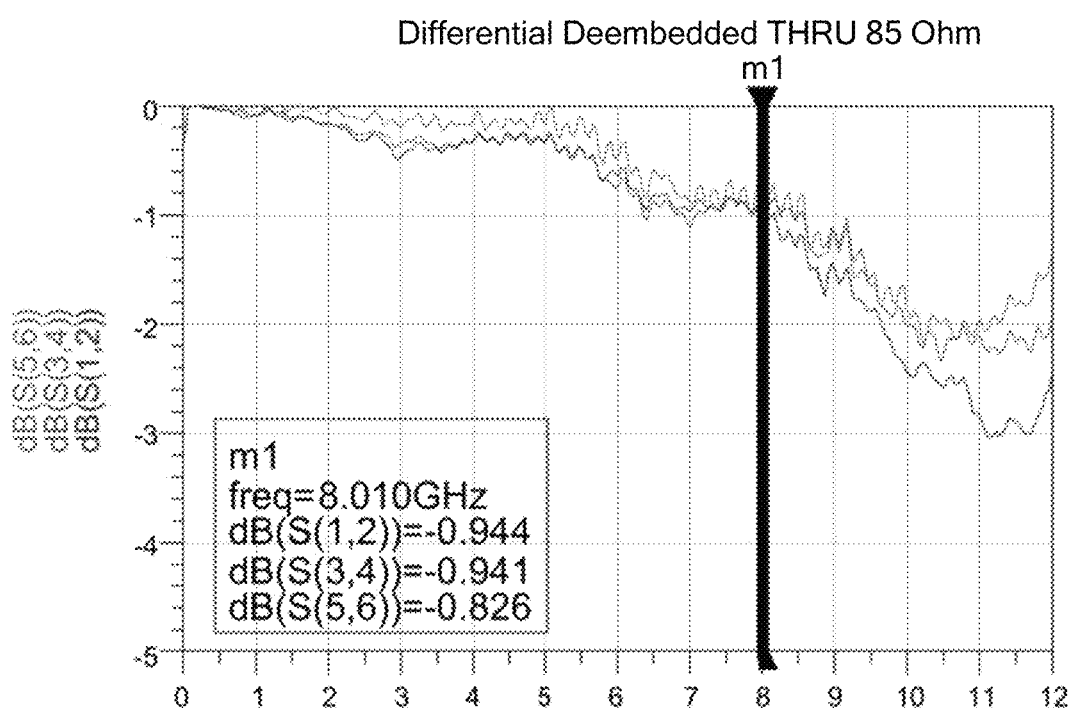
FIG. 7 is a simulation diagram of a signal insertion loss waveform according to an embodiment of the present disclosure.
Figure 8:
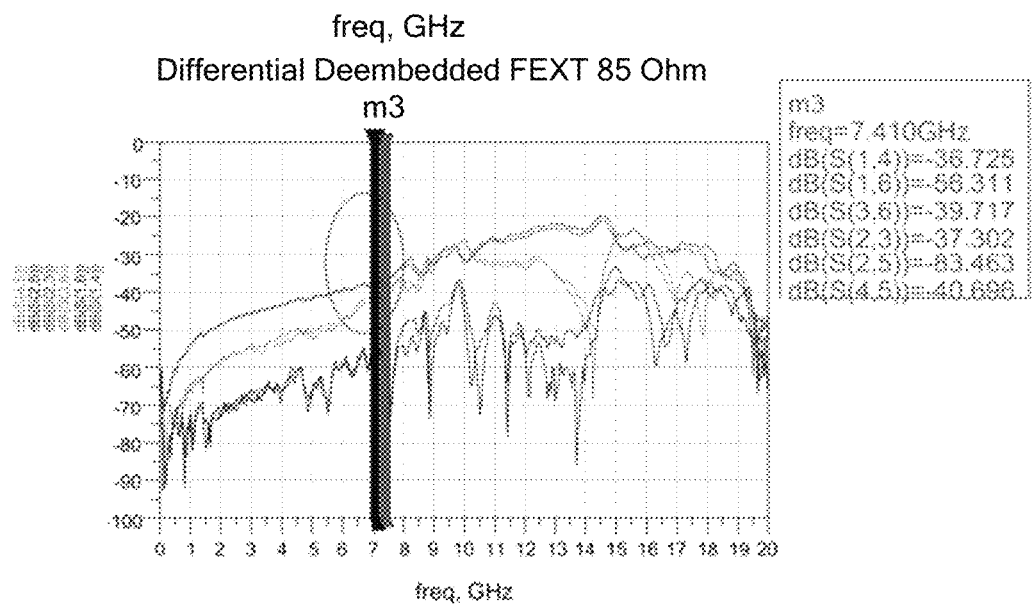
FIG. 8 is a simulation diagram of a near-end crosstalk frequency domain waveform according to an embodiment of the present disclosure.
Figure 9:
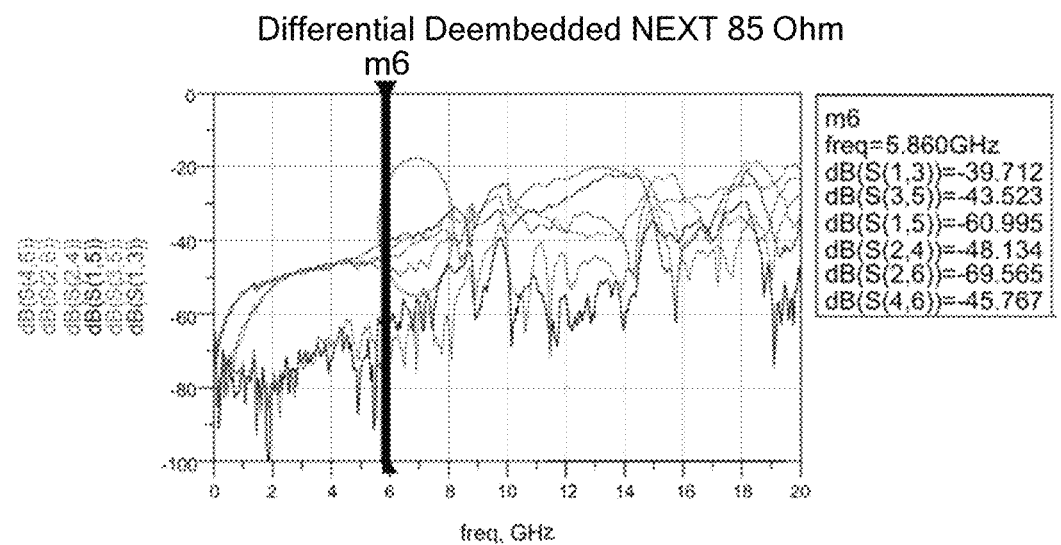
FIG. 9 is a simulation diagram of a far-end crosstalk frequency domain waveform according to an embodiment of the present disclosure.

With the method for designing a layout of a card edge connector according to the embodiment of the present disclosure, the simulation waveform diagrams as shown in FIG. 7 to FIG. 9 are obtained by performing signal simulation on the layout of the edge connector. FIG. 7 is the simulation diagram of the signal insertion loss waveform according to the embodiment of the present disclosure, FIG. 8 is the simulation diagram of the near-end crosstalk frequency domain waveform according to the embodiment of the present disclosure, and FIG. 9 is the simulation diagram of the far-end crosstalk frequency domain waveform according to the embodiment of the present disclosure. As shown in FIG. 7 to FIG. 9, by using the method for designing a layout of a card edge connector according to the embodiment of the present disclosure, the number of the resonance points of each waveform in the frequency point range of 7

GHz to 8 GHz is significantly reduced, thereby effectively improving the transmission quality of PCIE 4.0 signals.

In summary, in the present disclosure, by increasing the number of the GND vias interconnected to the GND pin of the card edge connector, and improving the arrangement of the GND vias and the way the GND pin is connected to the GND vias, the transmission quality of the high-speed signal is improved, the degree of attenuation during high-speed signal transmission is reduced, and the excessive signal return path between the GND pin and the GND vias is effectively avoided, thus reducing coupling crosstalk between signals. Therefore, the transmission quality of the signal of the card can be greatly improved by the design method of the present disclosure.

Second Embodiment

A server card is further provided in the present disclosure, where the server card includes an edge connector, and a layout of the edge connector is designed according to the above-mentioned method. In an embodiment, multiple GND pins are provided in the edge connector of the server card, and each of the GND pins is connected to two or more GND vias to form one signal return path.

The GND pins of the card edge connector includes a single GND pin and a dual GND pin. In the server card, the numbers of GND vias set for different types of the GND pin are different. Each single GND pin is connected to two GND vias to form one signal return path, and each dual GND pin is connected to three GND vias to form one signal return path.

In any signal return path according to the present disclosure, all GND vias are arranged in close proximity to the GND pin in the signal return path.

Further, a distance between the GND pin of the card edge connector and each GND via that matches with said GND pin in one signal return path is 10-20 μm. In this way, the signal return path is effectively optimized, thereby avoiding the resonance point in the signal insertion loss waveform, the near-end crosstalk frequency domain waveform and the far-end crosstalk frequency domain waveform in the high frequency section, which reduces the signal transmission error rate and improves the operation stability of the entire server card system.

The design method and design principle of the layout of the server card edge connector in this embodiment of the present disclosure have been described in detail in the embodiments shown in FIG. 5 to FIG. 9, which are not elaborated herein again. Reference can be made to each other of the two embodiments.

The above described are merely some embodiments of the present disclosure, so that those skilled in the art can understand or implement the present disclosure. Various modifications to these embodiments are obvious to those skilled in the art, and the general principles defined herein may be implemented in other embodiments without departing from the spirit or scope of the present disclosure. Therefore, the present disclosure is not limited to the embodiments described herein, but is to be accorded the broadest scope of the principles and novel features disclosed herein.

The invention claimed is:

1. A method for designing a layout of a card edge connector, comprising:
    determining, based on a type of a GND pin of a card edge connector and space between the card edge connector and GND vias, the number of GND vias connected to the GND pin to maximize the number of the GND vias connected to the GND pin;
    connecting each GND pin to all the GND vias that match with said GND pin to form one signal return path; and
    minimizing a length of the signal return path by setting all the GND vias that match with said GND pin in close proximity to said GND pin in the signal return path.

2. The method according to claim 1, wherein determining, based on the type of the GND pin of the card edge connector and the space between the card edge connector and the GND vias, the number of the GND vias connected to the GND pin to maximize the number of the GND vias connected to the GND pin comprises:
    determining the number of GND vias connected to a single GND pin to be two; and
    determining the number of GND vias connected to a dual GND pin to be three.

3. The method according to claim 2, wherein connecting each GND pin to all the GND vias that match with said GND pin to form the signal return path comprises:
    connecting each single GND pin of the card edge connector to two GND vias that match with said single GND pin, whereby said single GND pin and the two GND vias are connected in the same plane; and
    connecting each dual GND pin of the card edge connector to three GND vias that match with said dual GND pin, whereby said dual GND pin and the three GND vias are connected in the same plane.

4. The method according to claim 1, wherein minimizing the length of the signal return path by setting all the GND vias that match with said GND pin in close proximity to said GND pin in the signal return path comprises:
    setting a distance between the GND pin of the card edge connector and each GND via that matches with said GND pin to 10-20 μm.

5. A server card, comprising an edge connector, wherein a plurality of GND pins are provided in the edge connector, and each of the GND pins is connected to two or more GND vias to form one signal return path.

6. The server card according to claim 5, wherein the GND pins provided in the edge connector comprise a single GND pin and a dual GND pin.

7. The server card according to claim 6, wherein each single GND pin is connected to two GND vias, and each dual GND pin is connected to three GND vias.

8. The server card according to claim 5, wherein a distance between the GND pin of the card edge connector and each GND via that matches with said GND pin in the signal return path is 10-20 μm.

9. The server card according to claim 6, wherein a distance between the GND pin of the card edge connector and each GND via that matches with said GND pin in the signal return path is 10-20 μm.

10. The server card according to claim 7, wherein a distance between the GND pin of the card edge connector and each GND via that matches with said GND pin in the signal return path is 10-20 μm.

* * * * *